United States Patent [19]

Cox

[11] Patent Number: 4,691,222

[45] Date of Patent: Sep. 1, 1987

[54] METHOD TO REDUCE THE HEIGHT OF THE BIRD'S HEAD IN OXIDE ISOLATED PROCESSES

[75] Inventor: Eugene R. Cox, Puyallup, Wash.

[73] Assignee: Harris Corporation, Melbourne, Fla.

[21] Appl. No.: 857,995

[22] Filed: May 1, 1986

Related U.S. Application Data

[62] Division of Ser. No. 588,727, Mar. 12, 1984, Pat. No. 4,612,701.

[51] Int. Cl.$^4$ .................... H01L 27/04; H01L 29/34; H01L 29/06
[52] U.S. Cl. .................................... 357/50; 357/54; 357/55
[58] Field of Search .................. 357/49, 50, 55, 54

[56] References Cited

U.S. PATENT DOCUMENTS

| | | |
|---|---|---|
| 3,900,350 | 8/1975 | Appels et al. . |
| 3,961,999 | 6/1976 | Antipov . |
| 4,002,511 | 1/1977 | Magdo et al. . |
| 4,088,516 | 5/1978 | Kondo et al. . |
| 4,104,086 | 8/1978 | Bondur et al. ......................... 357/50 |
| 4,373,252 | 2/1983 | Caldwell ............................... 357/50 |
| 4,435,898 | 3/1984 | Gaur et al. ............................ 357/50 |
| 4,580,331 | 4/1986 | Soclof ................................... 357/50 |

Primary Examiner—Gene M. Munson
Attorney, Agent, or Firm—Barnes & Thornburg

[57] ABSTRACT

The bird's heads of a local oxidation process are minimized by performing a polishing or grinding step to reduce the height of the bird's head down to a plane using the oxide inhibiting mask of the local oxidation process as a polishing stop.

2 Claims, 4 Drawing Figures

METHOD TO REDUCE THE HEIGHT OF THE BIRD'S HEAD IN OXIDE ISOLATED PROCESSES

This is a division of application Ser. No. 588,727 filed Mar. 12, 1984, now U.S. Pat No. 4,612,701.

BACKGROUND AND SUMMARY OF THE INVENTION

The present invention relates generally to localized oxidation and more specifically to a method of reducing bird's heads in a localized oxidation process.

Localized oxidation which includes placing an oxide inhibiting mask over a semiconductor substrate and oxidizing the exposed portions of the substrate, has become a standard tool of the trade in fabrication of integrated circuits. One of the most popular masks is silicon nitride which is generally separated from the substrate by a thin oxide layer. One of the major uses of localized oxidation is to form a deep oxide region in the substrate which can be used for lateral isolation. One of the by-products of localized oxidation, is the lateral growth of oxide which produces a gradually increasing thickness of the oxide layer between the substrate and the nitride which is known as the bird's beak and a raised portion at the edge of the beak and the nitride mask which is known as a bird's head. Depending upon the specific structure and process steps, the bird's head may be in the order of 4,000–5,000 Angstroms in height.

Since it is generally preferable to have a substantially planar surface of the lateral oxide region and the substrate, the exposed portions of the substrate are etched to a given depth prior to oxidation. With significant bumps on the surface of the substrate produced by the bird's heads, subsequent oxide, mask and other layers must account for this unevenness and therefore masking accuracy and alignment are affected. This causes designers to use substantially more space than desired to assure the desired accuracy within the optical capability of the system.

Realizing the problems of bird's beaks and bird's heads, the prior art has offered many solutions.

U.S. Pat. No. 4,088,516 appears to solve the bird head problem by applying a vitrous solution to fill the undercutting of the silicon nitride layer so as to suppress lateral oxide growth. U.S. Pat. No. 3,900,350 reduces the bird's beak problem by providing a layer of polycrystalline silicon between the silicon substrate and the silicon nitride mask. U.S. Pat. No. 3,961,999 uses a chemical vapor deposition of silicon dioxide prior to thermal oxidation to minimize bird's beak and bird's head. U.S. Pat. No. 4,002,511 eliminates the bird's beak effect by forming the silicon nitride totally over the silicon dioxide layer so as to prevent lateral oxidation.

Generally, these processes include additional chemical steps or masking layers which increase the cost as well as affect the lateral area on the substrate which must be used to perform these additional steps. Thus, there exists the need for a process which does not use additional chemical steps to reduce the bird's head in a local oxidation process.

An object of the present invention is to provide a mechanical process for minimizing the bird's head effect in a localized oxidation process.

Another object of the present invention is to provide a process which minimizes bird's heads without introducing additional chemical steps.

A further object of the present invention is to provide a process which minimizes bird's heads without the addition of contaminant producing steps.

A still further object of the present invention is to provide a bird's head substantially planar with an oxide inhibiting mask.

These and other objects of the invention are attained by performing standard localized oxidation process to form the local oxidation through an oxide inhibiting mask including the formation of bird's heads and grinding the bird's heads to a plane using the mask as a polishing stop. This standard oxidizing process includes forming an oxide inhibiting mask on the substrate generally of silicon nitride with a barrier surface between the silicon nitride and the substrate, forming openings in the mask to expose portions of the substrate and oxidizing exposed portions of the substrate. Preferably, the substrate is silicon with the barrier region being silicon dioxide. Prior to the oxidation, the exposed portions of the substrate are etched.

DETAILED DESCRIPTION OF THE DRAWINGS

Figure 1:
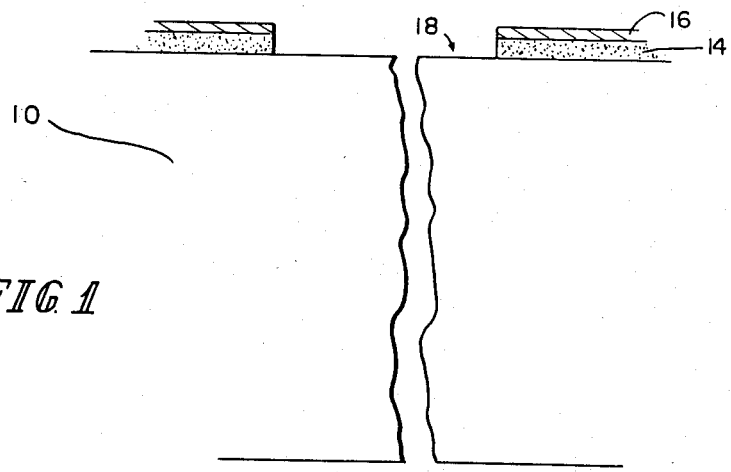
FIGS. 1 through 4 show a cross-sectional diagrams of a wafer during various stages of a process incorporating the principles of the present invention.

A substrate 10, preferably of silicon has a barrier layer 14 of preferably silicon dioxide formed thereon and a oxide inhibiting mask layer 16 preferably silicon nitride. Typically, the silicon dioxide layer 14 is grown by thermal oxidation although it may be formed by chemical vapor deposition to a thickness in the range of 200 to 800 Angstroms. The silicon nitride layer 16 is formed by chemical vapor deposition to a thickness generally in the range of 800 to 2500 Angstroms. An opening 18 is formed in the oxide inhibiting mask layer 16 and the barrier layer 14 to exposed surface of the substrate 10. This opening may be formed by a combination of dry and wet etching. For example, a dry etch plasma of $CF_4$ would etch a silicon nitride layer 16 and a wet HF solution would etch the silicon dioxide layer 14 without effecting a silicon substrate 10. The structure at this point is illustrate in FIG. 1.

Figure 2:
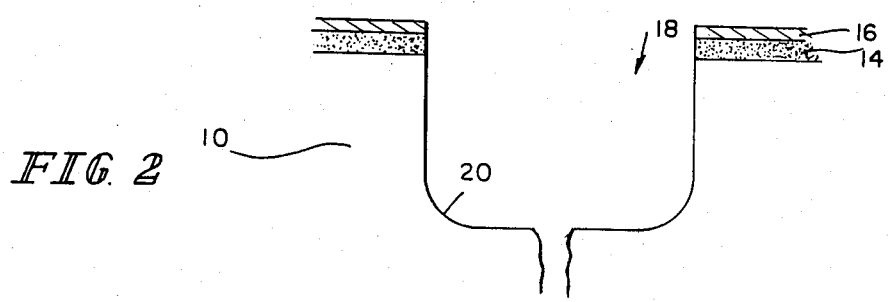

For deep localized oxidation barriers, it is desirable to etch the silicon substrate 10. This is illustrated in FIG. 2 wherein the oxide inhibiting layer 16 and the barrier layer 14 are used as a mask to etch an opening 20 of the exposed portion of the substrate 10. This may be performed by a dry or wet etching. Preferably, reactive ion etching is used although a wet etching solution of $CrO_3/HF$ or $HF/HNO_3$ may be used.

Figure 3:
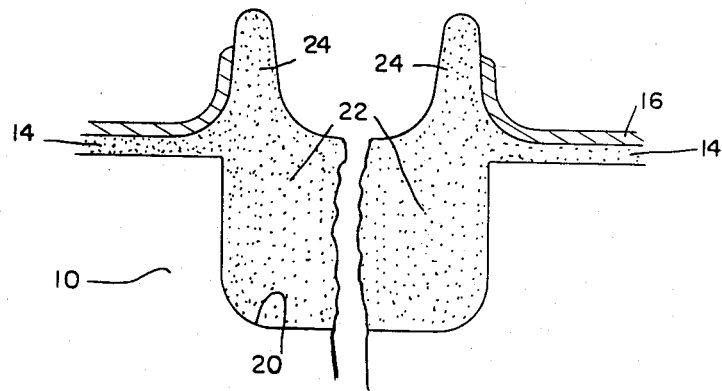
Figure 4:
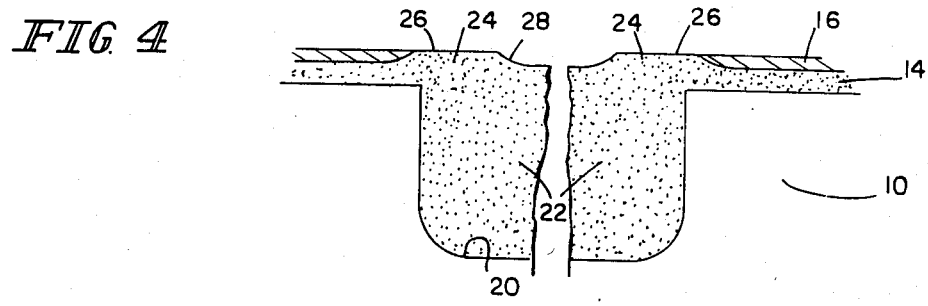

The wafer at this stage of production is exposed to an oxidizing atmosphere to form oxide in the exposed portion of the substrate 10. The oxidation process is carried out until the recess 20 is overfilled resulting in an oxide insert 22 having bird's heads 24. A bird's beak portion occurs under the exposed edge of the silicon nitride layer 16 and raises the edge slightly. The resulting structure at this stage is illustrated in FIG. 3. As an example, an oxide atmosphere would include the gases $H_2/O_2$ and is performed for a period in the range of 10 to 15 hours at a temperature in the range of 950° to 1050° C. For a recess 20 having a width of approximately 10 microns and a depth of approximately 0.65 microns, the insert 22 will have a depth of approximately 1.5 microns from the surface and includes bird beaks 24 having a height from the surface of the substrate in the range of 4000 to 6000 Angstroms.

In order to reduce the bird's head 24, the substrate is subjected to a mechanical polishing step. This results in grinding down of the bird's head 24 to a plane 26 substantially level with the surface of the oxide inhibiting mask 16 which acts as a polishing step. Since the inhibiting mask 16 may be in the range of 800 to 2500 Angstroms, the height of the bird's head 24 after polishing will be in the 800 to 2500 Angstrom range. The grinding or polishing process not only lowers the height of the bird's beak 24, but also removes a portion of the raised edge of the oxide inhibiting mask 16 thereby to produce a substantially planar structure across the top of the substrate. There is a small depression or central portion 28 encompassed by the flattened bird's head 24 which does not adversely affect the further processing compared to bird's heads of the prior art. The width of the insert 22 is limited to prevent substantial depression or "dishing out" of the central portion 28. Preferably, the central portion 28 is coplanar with the top of oxide layer 14. The inhibiting mask 16 may be removed by etching or left on for subsequent processing.

It is evident from the detailed description of the present invention that the objects of the invention are attained in that a mechanical step is used to minimize bird's heads in a local oxidation process. Although the invention has been described and illustrated in detail, it is to be clearly understood that the same is by way of illustration and example only. Other oxide inhibiting masks may be used instead of silicon nitride although it is the preferred and commercially available oxide inhibiting mask. Also, the barrier layer 14 may be other than silicon dioxide. The spirit and scope of the invention are to be limited only by the terms of the appended claims.

What is claimed is:

1. A semiconductor structure comprising:
   a substrate of semiconductor material;
   a plurality of oxide inserts extending into said substrate and having a central portion and a head portion extending above said central portion about the periphery of said central portion, said head portion having a planar top surface;
   an oxide layer on said substrate and the top of said central portion is substantially coplaner with the top of said oxide layer; and
   an oxide inhibiting layer on said oxide layer and said planar surface of said head portion is substantially coplaner with the top surface of said oxide inhibiting layer.

2. A semiconductor substrate according to claim 1, wherein said oxide inhibiting layer is a nitride.

* * * * *